US012800957B2

(12) United States Patent
Fukaya

(10) Patent No.: US 12,800,957 B2
(45) Date of Patent: Nov. 17, 2026

(54) DISPLAY DEVICE

(71) Applicant: Sharp Display Technology Corporation, Kameyama City (JP)

(72) Inventor: Tetsuo Fukaya, Kameyama City (JP)

(73) Assignee: Sharp Display Technology Corporation, Kameyama City (JP)

( * ) Notice: Subject to any disclaimer, the term of this patent is extended or adjusted under 35 U.S.C. 154(b) by 212 days.

(21) Appl. No.: 18/930,924

(22) Filed: Oct. 29, 2024

(65) Prior Publication Data

US 2025/0180944 A1 Jun. 5, 2025

(30) Foreign Application Priority Data

Dec. 5, 2023 (JP) ................................ 2023-205523

(51) Int. Cl.

| | |
|---|---|
| ***G02F 1/133*** | (2006.01) |
| ***G02F 1/00*** | (2006.01) |
| ***G02F 1/1335*** | (2006.01) |
| ***G02F 1/13357*** | (2006.01) |
| ***G02F 1/1365*** | (2006.01) |
| ***G02F 1/1368*** | (2006.01) |
| ***H10K 59/50*** | (2023.01) |

(52) U.S. Cl.

CPC ........ *G02F 1/13312* (2021.01); *G02F 1/0063* (2013.01); *G02F 1/13318* (2013.01); *G02F 1/133616* (2021.01); *G02F 1/133617* (2013.01); *G02F 1/1365* (2013.01); *G02F 1/1368* (2013.01); *H10K 59/50* (2023.02); *G02F 2202/14* (2013.01)

(58) Field of Classification Search

CPC .......... G02F 1/133617; G02F 1/13312; G02F 1/13318; G02F 2202/14

USPC ........................................................... 349/24

See application file for complete search history.

(56) References Cited

U.S. PATENT DOCUMENTS

| | | | | |
|---|---|---|---|---|
| 2009/0303419 | A1 | 12/2009 | Koma | |
| 2013/0335680 | A1* | 12/2013 | Su | G02F 1/1336 257/40 |
| 2020/0207187 | A1* | 7/2020 | Smit | G02F 1/23 |
| 2022/0187632 | A1* | 6/2022 | Lim | G02F 1/133509 |
| 2024/0379038 | A1* | 11/2024 | Yang | G09G 3/2007 |

FOREIGN PATENT DOCUMENTS

| | | |
|---|---|---|
| JP | 2010-015117 A | 1/2010 |

* cited by examiner

*Primary Examiner* — Christopher M Raabe
(74) *Attorney, Agent, or Firm* — ScienBiziP, P.C.

(57) ABSTRACT

Provided is a display device that can exhibit, with a simple structure and a simple control mechanism, improved display quality as both a non-luminous type display device and a self-luminous type display device. The display device includes a display unit, and a light control unit disposed adjacent to a light emitting surface side of the display unit, the light control unit exhibiting a higher visible light transmittance as an intensity of visible light incident from the display unit increases.

7 Claims, 10 Drawing Sheets

DISPLAY DEVICE

CROSS-REFERENCE TO RELATED APPLICATIONS

The present application claims priority under 35 U.S.C. § 119 to Japanese Patent Application No. 2023-205523 filed on Dec. 5, 2023, the contents of which are incorporated herein by reference in their entirety.

BACKGROUND OF THE INVENTION

Field of the Invention

The following disclosure relates to display devices.

Description of Related Art

Display devices have been widely used for electronic devices such as televisions, smartphones, tablet computers, and car navigation systems. Recently used display devices are roughly classified into non-luminous type display devices in which their display element such as a liquid crystal display itself does not emit light and controls a light source such as a backlight, and self-luminous type display devices in which their display element such as an organic EL display itself emits light.

Display devices in different display modes have different display quality problems. For example, non-luminous type display devices such as liquid crystal displays require a light source such as a backlight since their display element does not emit light, and the light source may cause light leakage to decrease the contrast ratio. A dual-cell display device including a light controlling liquid crystal panel between a backlight and a liquid crystal panel has been suggested as a countermeasure against the above problem (e.g., JP 2010-015117 A).

BRIEF SUMMARY OF THE INVENTION

A dual-cell display device, however, requires a complex structure and complex control for pixel-level light control, which increases the cost.

Meanwhile, self-luminous type display devices such as organic EL displays can provide display with a higher contrast ratio than non-luminous type display devices. Yet, in these devices, the luminance of display at a first grayscale (grayscale (GL)=1) in the case where the grayscale level for black display is 0 is too high, meaning that making the transmittance change (gamma curve) suitable for each grayscale level is difficult. This problem may possibly be solved by pixel-level light control as in the case of a dual-cell display device, but a complex structure and complex control are still required. For these reasons, a method is desired that improves the display quality of both non-luminous type display devices and self-luminous type display devices with a simpler structure and simpler control.

In response to the above issues, an object of the present invention is to provide a display device that can exhibit, with a simple structure and a simple control mechanism, improved display quality as both a non-luminous type display device and a self-luminous type display device.

The present disclosure includes the following Disclosures 1 to 7. The following describes the details of the present disclosure.

Disclosure 1

A display device including a display unit and a light control unit disposed adjacent to a light emitting surface side of the display unit, the light control unit exhibiting a higher visible light transmittance as an intensity of visible light incident from the display unit increases.

Disclosure 2

The display device according to Disclosure 1, wherein the display unit is a liquid crystal display including a pair of polarizing plates and a liquid crystal layer sandwiched between the pair of polarizing plates.

Disclosure 3

The display device according to Disclosure 1, wherein the display unit is a self-luminous type display.

Disclosure 4

The display device according to Disclosure 1, 2, or 3, wherein the light control unit includes a photochromic material layer containing a photochromic material and a UV front light disposed adjacent to the photochromic material layer, and the photochromic material shifts into a state that allows passage of visible light in response to incidence of visible light from the display unit and shifts into a state that blocks visible light in response to incidence of UV light from the UV front light.

Disclosure 5

The display device according to Disclosure 4, wherein the photochromic material is aligned in a constant direction in the photochromic material layer, and the photochromic material layer has an absorption axis parallel to a polarization axis of emission light from the display unit.

Disclosure 6

The display device according to Disclosure 1, 2, or 3, wherein the light control unit is a normally white display element including a TFT substrate, the TFT substrate includes drain electrodes, source electrodes, and photoresistors or photodiodes disposed at positions where visible light from the display unit is incident, the photoresistors or the photodiodes each connect a corresponding drain electrode to one of the source electrodes adjacent to the drain electrode, and the light control unit includes a light blocking layer above the photoresistors or the photodiodes.

Disclosure 7

The display device according to Disclosure 1, 2, or 3, wherein the light control unit is a normally white display element including a TFT substrate, the TFT substrate includes a semiconductor layer at a position where visible light from the display unit is incident, and source electrodes and drain electrodes connected via the semiconductor layer, and the light control unit includes a light blocking layer above the semiconductor layer.

The present invention can provide a display device that can exhibit, with a simple structure and a simple control mechanism, improved display quality as both a non-luminous type display device and a self-luminous type display device.

DETAILED DESCRIPTION OF THE INVENTION

Hereinbelow, display devices of embodiments of the present invention are described. The present invention is not limited to the contents described in the following embodiments. The design can be modified as appropriate within the range satisfying the configuration of the present invention.

Embodiment 1

Figure 1:
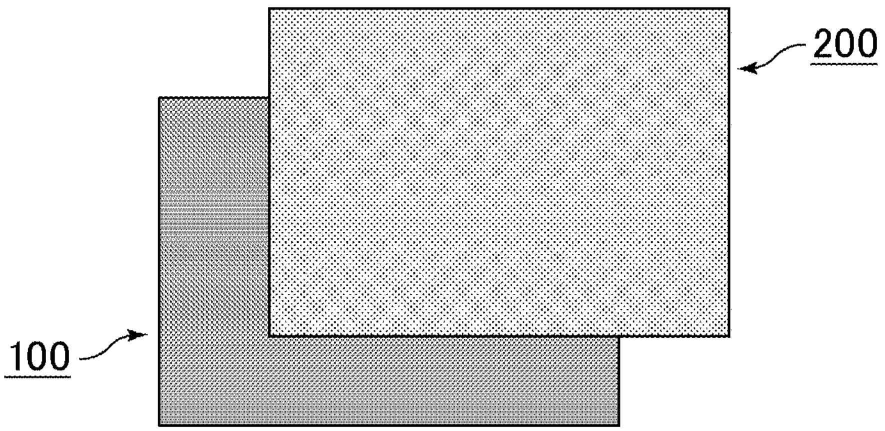
FIG. 1 is a schematic view of a display device of Embodiment 1.

FIG. 1 is a schematic view of a display device of Embodiment 1. A display device of Embodiment 1 includes a display unit 100 and a light control unit 200 disposed adjacent to a light emitting surface side of the display unit 100. The light control unit 200 exhibits a higher visible light transmittance as the intensity of visible light incident from the display unit 100 increases (hereinbelow, visible light is also simply referred to as light). Such a light control unit 200 disposed adjacent to the display unit 100 transmits high-intensity light from pixels providing white display in the display unit 100 while blocking light having an intensity as low as light leaking from subpixels providing black display. This can increase the contrast ratio of the display device. Also, compared with devices including mini-LEDs free of the contrast ratio problem that affects common liquid crystal displays, the display device provides sharp black display when light is weak, so that a halo effect is less likely to occur. In addition, the display device of Embodiment 1 uses light from the display unit to control the transmittance, and thus can increase the contrast ratio with a simpler structure and a less complicated control mechanism than a dual-cell display device.

Herein, "black display" means the display state where light from the display unit side is blocked or the display unit does not emit light, and "white display" means the display state where light from the display unit side is transmitted or the display unit emits light. In other words, the "white display" means not only a display state displaying white color but also a display state displaying any color except for black color. The "visible light" means light having a wavelength from 360 nm to 830 nm.

Figure 2:
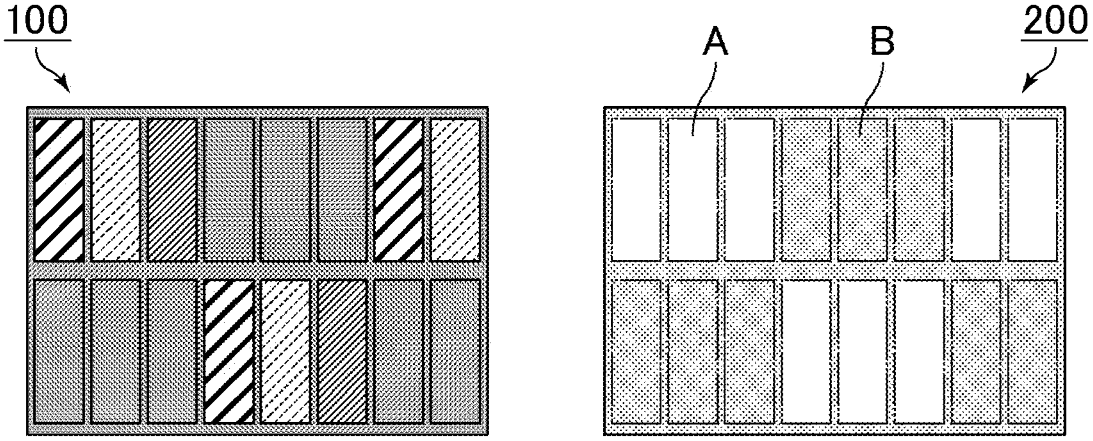
FIG. 2 includes schematic views showing an example of display on a display unit and an example of display on a light control unit in the display device of Embodiment 1.

FIG. 2 includes schematic views showing an example of display on the display unit and an example of display on the light control unit in the display device of Embodiment 1. In the display unit 100 in FIG. 2, subpixels filled with oblique lines provide white display, and subpixels filled with solid gray provide black display.

When the display unit 100 is in the display state shown on the left in FIG. 2, in the light control unit 200 in the display device of Embodiment 1, the light control unit in the subpixels (e.g., subpixel A) above the subpixels providing white display is made transparent by light, and transmits light. Meanwhile, in subpixels (e.g., subpixel B) above the subpixels providing black display, the light control material remains opaque because only light with an intensity as low as leaked light reaches the light control unit. This significantly reduces light leakage in subpixels providing black display, thus increasing the contrast ratio of the display device.

Herein, "top", "above", or the like expression indicates the direction of the observer in the thickness direction of the display device, and "bottom", "below", or the like expression indicates the direction that is opposite to the "top", "above", and the like expression and is of the back surface side of the display device.

The display devices of Embodiment 1 and the embodiments below can increase the contrast ratio when their display unit is a non-luminous type display such as a liquid crystal display, and these display devices still can improve the display quality even when their display unit is a self-luminous type display such as an organic EL display capable of providing display with a high contrast ratio. In organic EL displays, the luminance of display at a first grayscale (grayscale (GL)=1) in the case where the grayscale level for black display is 0 may be too high, meaning that making the transmittance change (gamma curve) suitable for each grayscale level may be difficult. The display device of the present embodiment can use the above light control unit to reduce an increase in luminance at GL=1, and thus can reduce unfavorable changes in gamma curve.

The display unit can be a display in which its display element does not emit light and controls light from the backlight (non-luminous type display) or a display that uses a self-luminous element (self-luminous type display). Examples of the non-luminous type display include liquid crystal displays including a pair of polarizing plates and a liquid crystal layer sandwiched between the pair of polarizing plates; electrowetting displays; and electronic paper displays. Examples of the self-luminous type displays include organic EL displays (OLED), quantum dot LED displays, and LED displays.

Figure 3:
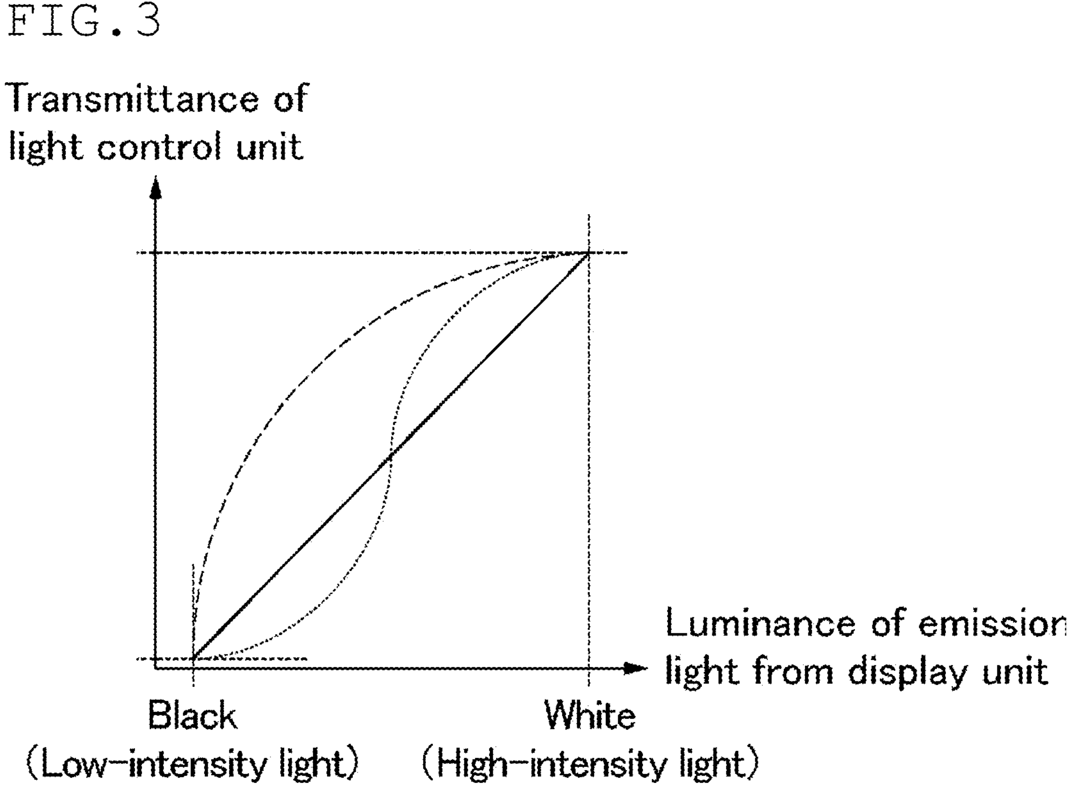
FIG. 3 is a graph of transmittance characteristics of the light control unit in the display device of Embodiment 1.

FIG. 3 is a graph of transmittance characteristics of the light control unit in the display device of Embodiment 1. The material or element used for the light control unit in the present embodiment preferably has a transmittance characteristic that it blocks high-intensity light and exhibits a higher transmittance as the intensity of light increases. Specifically, as shown by the solid straight line in FIG. 3, the material or element particularly preferably has a transmittance characteristic that the intensity of light and the light transmittance are linearly proportional to each other. Still, as shown by the short-dashed curve, a material or element is also preferred that has a transmittance characteristic that the transmittance starts to rapidly increase at a certain intensity. Also, as shown by the long-dashed curve, a material having a transmittance characteristic that the transmittance starts to rapidly increase at a low intensity of light is preferably not used for further blocking of light leakage.

Specific examples of the effect of using the display device of Embodiment 1 are now described. When the display unit is a non-luminous type display, the effect of increasing the contrast ratio of the display device can be achieved. For example, when the display unit is a liquid crystal display having a contrast ratio (CR) of 2000 and the light control unit has a light (0.1 $cd/m^2$) transmittance during black display of 5% and a light (200 $cd/m^2$) transmittance during white display of 50%, the CR increases to 20000. When the display unit is a self-luminous type display, the effect of reducing undesirable changes in gamma curve can be achieved. For example, when the display unit is an organic EL display, the luminance at GL=1 of the display unit alone is 0.01 $cd/m^2$. This luminance at GL=1 is decreased to 0.001 $cd/m^2$ by using the above light control unit, so that adjustment of the gamma curve is further facilitated.

Embodiment 2

In a display device of Embodiment 2, the light control unit has a structure including a photochromic material layer containing a photochromic material, and a UV front light disposed adjacent to the photochromic material layer. The photochromic material has a nature of shifting into a state that allows passage of visible light in response to incidence of visible light from the display unit, and shifting into a state that blocks visible light in response to incidence of UV light from the UV front light.

Figure 4:
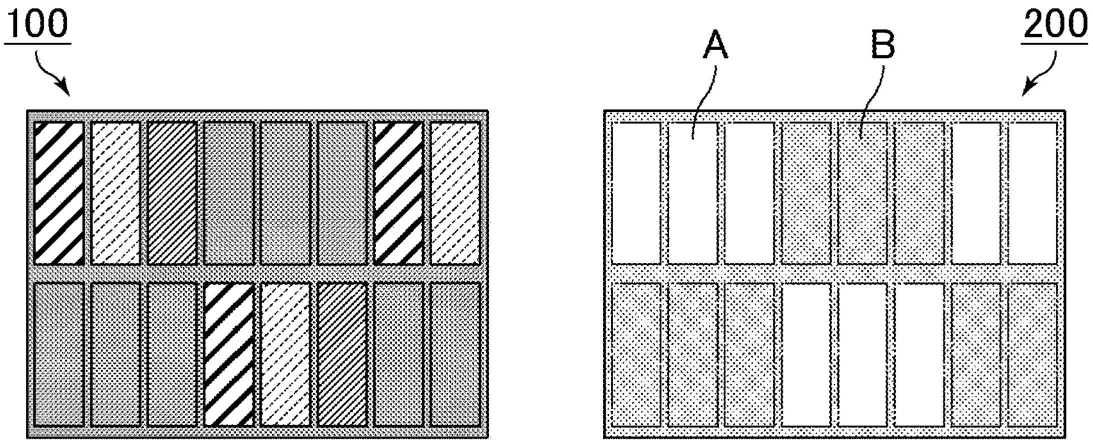
FIG. 4 includes schematic views showing an example of display on a display unit and an example of display on a light control unit in a display device of Embodiment 2.

FIG. 4 includes schematic views showing an example of display on a display unit and an example of display on a light control unit in the display device of Embodiment 2. In the display unit 100 in FIG. 4, subpixels filled with oblique lines provide white display, and subpixels filled with solid gray provide black display. When the display unit 100 is in the display state shown on the left in FIG. 4, in the light control unit 200 in the display device of Embodiment 2, the photochromic material in the subpixels (e.g., subpixel A) above the subpixels providing white display is made transparent by light, and transmits light. Meanwhile, in the subpixels (e.g., subpixel B) above the subpixels providing black display, the photochromic material remains opaque because only light with an intensity as low as leaked light reaches the photochromic material. The light control unit 200 thus significantly reduces light leakage in the subpixels providing black display in the display unit 100, thus increasing the contrast ratio of the display device. Also, since the photochromic material layer is irradiated with UV light from the UV front light, the photochromic material layer is not likely to be irradiated with high-intensity light. In other words, when a subpixel of the display unit directly below the photochromic material layer shifts into a state of providing black display, the photochromic material, irradiated with UV light from the UV front light, turns opaque and reduces light leakage until the subpixel shifts into the state of providing white display again. In this manner, the display device of Embodiment 2 requires no control by a circuit and thus can increase the contrast ratio with a simple structure.

The photochromic material can switch between a transmissive state that allows passage of visible light and a non-transmissive state that does not allow passage of visible light, and preferably has a nature of switching into the transmissive state in response to incidence of visible light during the non-transmissive state, while switching into the non-transmissive state in response to incidence of UV light during the transmissive state or after a lapse of time at room temperature. Specific examples thereof include organic compounds such as diarylethene and inorganic compounds such as $TiO_2$/Ag nanoparticles.

The photochromic material may be aligned such that the photochromic material layer has an absorption axis parallel to the polarization axis of emission light from the display unit. Aligning the photochromic material in a given direction to match the polarization axis of the polarized light from the display unit and the absorption axis of the photochromic material layer allows a further increase in luminance in the transmissive state.

The UV front light may be any front light that can shift the photochromic material from the transmissive state into the non-transmissive state. The wavelength and intensity of UV light to be emitted from the UV front light is adjusted as appropriate according to the nature of the photochromic material. Examples thereof include UV-C front lights. Such a UV front light may emit UV light constantly or may emit UV light periodically.

Specific examples of the effect of using the display device of Embodiment 2 are now described. A display device was produced that included a display unit including a liquid crystal display having a contrast ratio (CR) of 2000, and a light control unit including a photochromatic material layer having diarylethene as the photochromic material and a UV-C front light. The transmittance of the light control unit in the obtained display device was measured. The display unit had a light (0.1 $cd/m^2$) transmittance during black display of 6% and a light (200 $cd/m^2$) transmittance during white display of 36%, and the CR of the display device increased to 12000. Separately, a display device was produced by a procedure similar to that for the above display device, except that the photochromic material was aligned to match the absorption axis of the photochromic material layer and the polarization axis of the polarized light from the display unit. The display unit in this display device had a light transmittance during black display of 10% and a light transmittance during white display of 60%, which were higher than the respective transmittance values in the display device in which the photochromic material was not aligned. Still, the CR was the same as that in the display device in which the photochromic material was not aligned, i.e., 12000, since the absorption axis of the photochromic material layer was made to match the polarization axis of the polarized light from the display unit.

Embodiment 3

Figure 5:
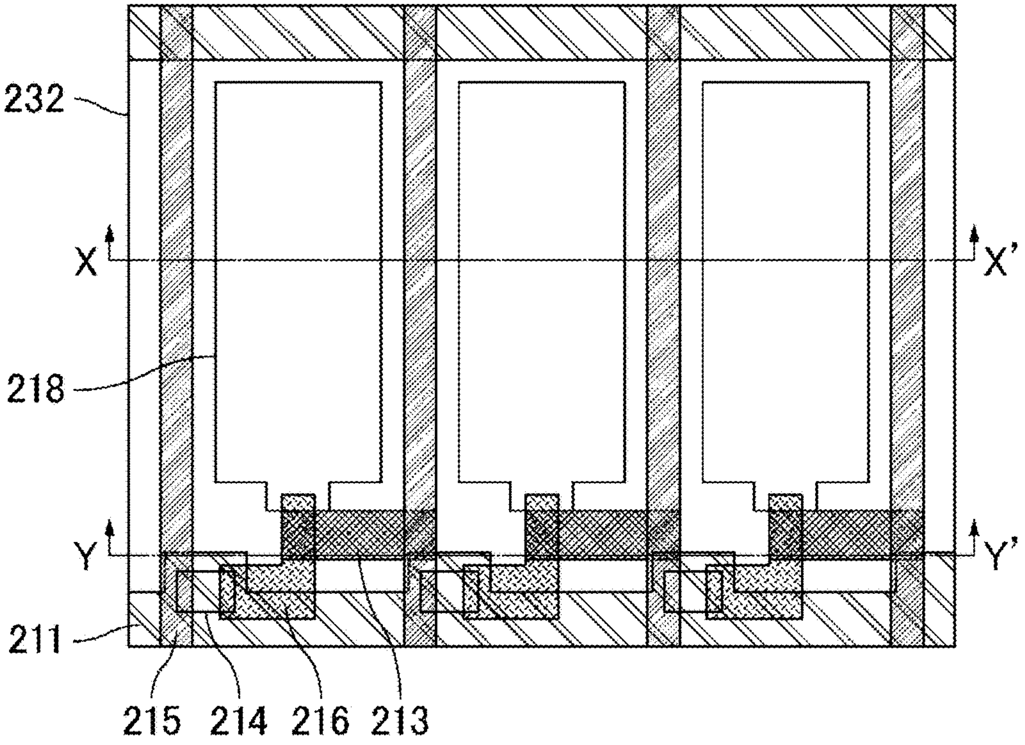
FIG. 5 is a top view of a light control unit in a display device of Embodiment 3.
Figure 6:
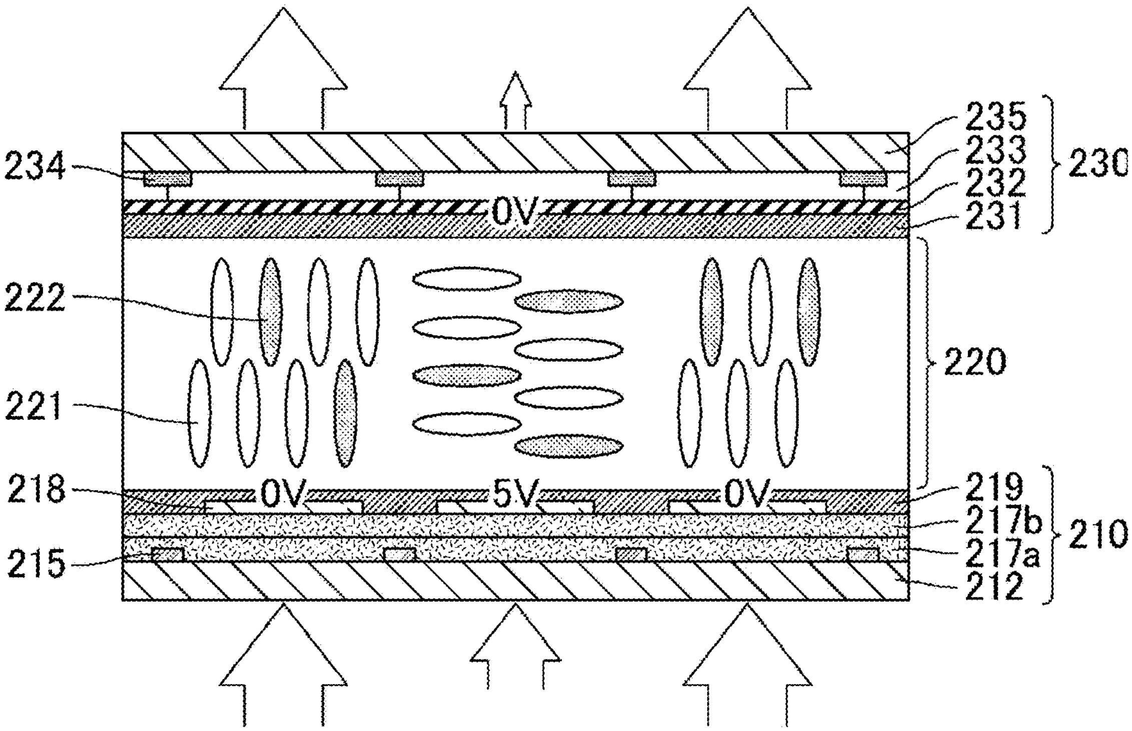
FIG. 6 is a cross-sectional view taken along the line X-X' in FIG. 5.
Figure 7:
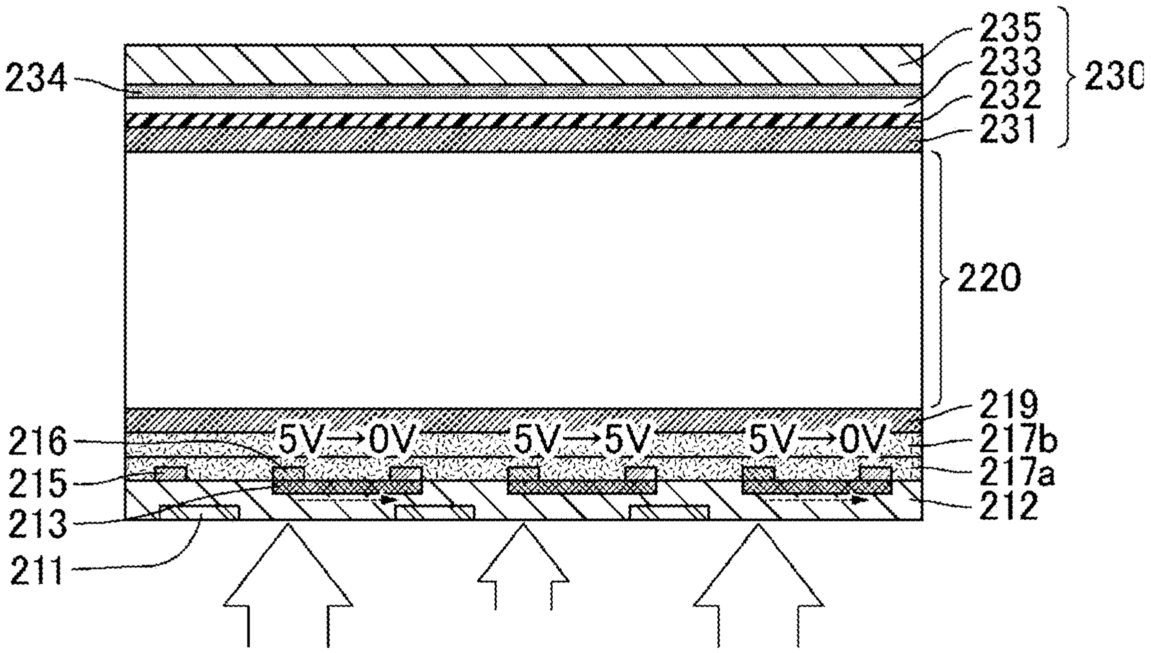
FIG. 7 is a cross-sectional view taken along the line Y-Y' in FIG. 5.
Figure 8:
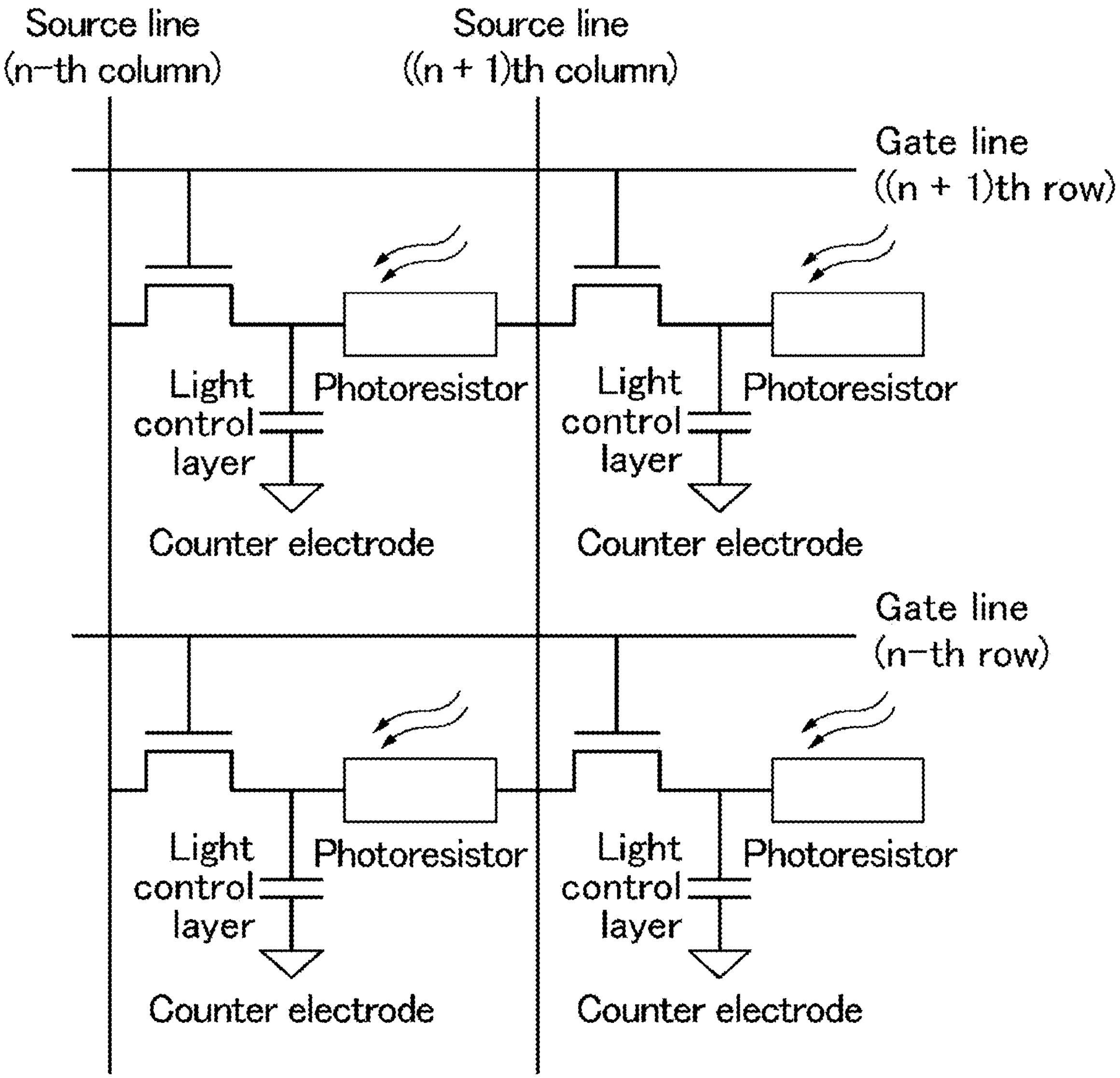
FIG. 8 is an equivalent circuit diagram of the light control unit in the display device of Embodiment 3.

A display device of Embodiment 3 is a normally white display element in which its light control unit includes a TFT substrate. FIG. 5 is a top view of the light control unit in the display device of Embodiment 3. FIG. 6 is a cross-sectional view taken along the line X-X' in FIG. 5. FIG. 7 is a cross-sectional view taken along the line Y-Y' in FIG. 5. FIG. 8 is an equivalent circuit diagram of the light control unit in the display device of Embodiment 3.

As shown in FIGS. 5 to 7, the light control unit in the display device of Embodiment 3 has a structure including a TFT substrate 210, a counter substrate 230, and a light control layer 220 disposed between these substrates. The TFT substrate 210 includes, on gate electrodes 211, a stack of a gate insulating layer 212, photoresistors or photodiodes 213 (hereinbelow, also referred to simply as photoresistors), a semiconductor layer 214, source electrodes 215, drain electrodes 216, a first interlayer insulating layer 217*a*, a second interlayer insulating layer 217*b*, pixel electrodes 218, and an alignment film 219. The counter substrate 230 includes, on an alignment film 231, a stack of a counter electrode 232, an overcoat layer 233, a light blocking layer 234, and a substrate 235. The light control layer 220 includes a liquid crystal material 221 and a dye 222. The photoresistors 213 each connect a drain electrode 216 to one of the source electrodes 215 adjacent to the drain electrode 216, and are disposed at positions where visible light from the display unit is incident. The light blocking layer 234 is disposed above the photoresistors 213. In addition, the liquid crystal material 221 and the dye 222 transmit visible light during no voltage application and block visible light during voltage application. The basic state (state where only the light control unit is driven) is the opaque state where voltage is applied to all the subpixels.

Although the light control unit in FIGS. 5 to 7 uses a guest host liquid crystal for the light control layer, any material may be used as long as the material causes the light control unit to be in the transparent state during no voltage application and to be in the opaque state during voltage application. Although FIGS. 6 and 7 show that the voltage applied to the light control layer is 5 V in the opaque state and is 0 V in the transparent state, the voltage is not limited to these values as long as it can switch the light control unit between the transparent state and the opaque state.

As shown in FIGS. 5 to 8, in the light control unit in Embodiment 3, the drain electrodes 216 are connected to the respective source electrodes 215 by the respective photoresistors 213. As shown in FIGS. 6 and 7, in the light control unit in Embodiment 3, when light from the display unit is incident on the photoresistors 213 in the subpixels (left and right subpixels) above the subpixels providing white display, the resistance of each photoresistor 213 decreases to cause current leakage from the drain electrode 216 to the source electrode 215, thus decreasing the voltage of the drain electrode 216. As a result, in the subpixels in which light has been incident on the photoresistors 213, voltage application to the light control layer 220 stops, so that the subpixels of the light control unit shift into the transparent state to transmit light from the subpixels of the display unit providing white display. The transparent state continues until light is no more applied to the photoresistors 213, i.e., until the subpixels of the display unit directly below the photoresistors 213 provide black display. Meanwhile, in a subpixel (central subpixel) above a subpixel providing black display, light incident on the photoresistor 213 is weak and does not change the resistance of the photoresistor 213 to the degree that the current leaks, so that the state where voltage is applied, i.e., the opaque state, is maintained. This significantly reduces light leakage from the display unit to increase the contrast ratio. The display device of Embodiment 3 has a more complex structure than those of Embodiments 1 and 2. Still, since the transparent state and the opaque state of the light control layer are switched by light from the display unit, the contrast ratio can be increased using a less complicated structure and less complicated control than dual-cell display devices.

Figure 9:
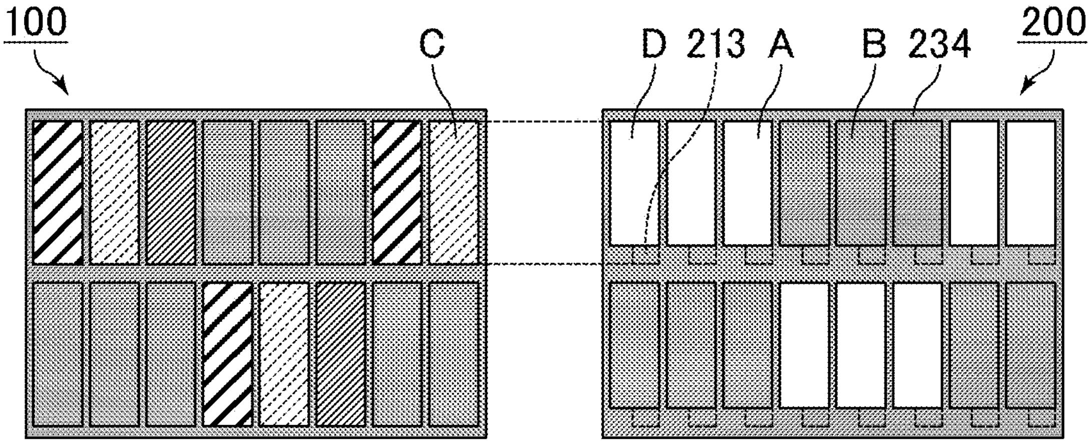
FIG. 9 includes schematic views showing an example of display on a display unit and an example of display on the light control unit in the display device of Embodiment 3.

FIG. 9 includes schematic views showing an example of display on the display unit and an example of display on the light control unit in the display device of Embodiment 3. In the display unit 100 in FIG. 9, subpixels filled with oblique lines provide white display, and subpixels filled with solid gray provide black display.

When the display unit 100 is in the display state shown on the left in FIG. 9, in the subpixels (e.g., subpixel A) of the light control unit 200 above the subpixels providing white display, light is incident on the photoresistor 213 to decrease the voltage of the drain electrode, so that the voltage application to the light control layer stops, which leads to the transparent state. Meanwhile, in the subpixels (e.g., subpixel B) of the light control unit 200 above the subpixels providing black display, the state where voltage is applied to the light control layer, i.e., the opaque state, is maintained because light in an amount that significantly decreases the resistance of the photoresistor 213 does not reach the photoresistor 213. The light control unit thus significantly reduces light leakage in the subpixels providing black display in the display unit 100, thus increasing the contrast ratio of the display device.

Figure 10:
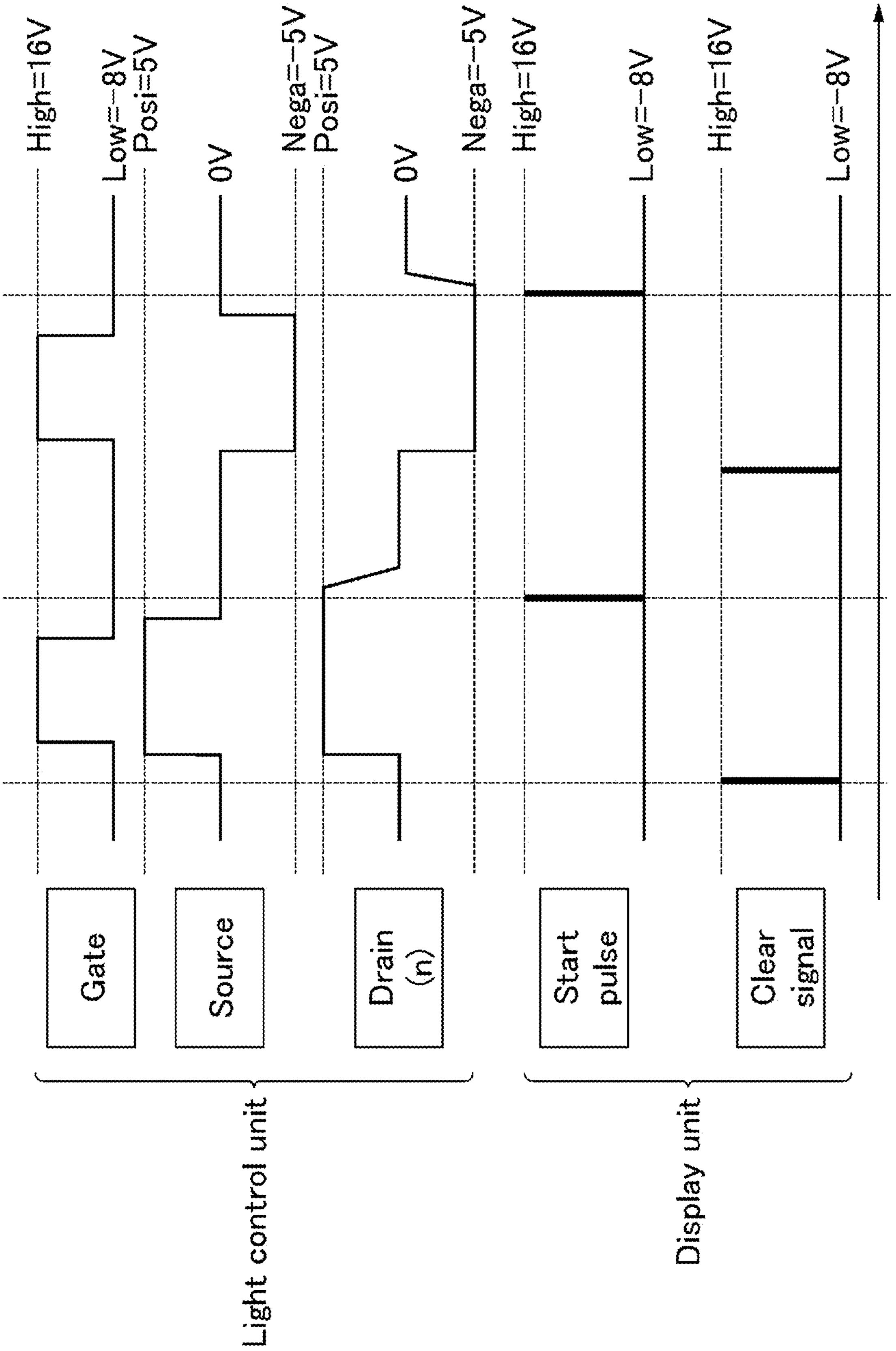
FIG. 10 is a timing diagram showing control of the light control unit in the display device of Embodiment 3.

As described above, since the light control unit in the display device of Embodiment 3 switches between black display and white display in response to light from the display unit, the light control unit needs to shift into the charging state (black display state) by applying voltage to the entire light control layer in response to the refresh of the display unit. FIG. 10 is a timing diagram showing control of the light control unit in the display device of Embodiment 3. FIG. 10 shows changes in voltage at subpixels (the left and right subpixels in FIGS. 5 to 7) directly below which the corresponding subpixels of the display unit provide white display. The gate electrodes in the light control unit of the display device of Embodiment 3 are controlled to change the voltage from Low to High in duration from the time of or following the clear signal from the display unit until the time of or prior to the start pulse signal, and then from High to Low again. The source electrodes are controlled to change the voltage from 0 V to a Posi voltage (positive voltage) or to a Nega voltage (negative voltage) in duration from the time of or following the clear signal from the display unit until the time of or prior to the start pulse signal, and then from the Posi or Nega voltage to 0 V again. Here, the duration for which the Posi voltage or Nega voltage is maintained includes, and is set longer than, the duration for which the gate electrodes are at High voltage. Here, the voltage at the drain electrodes changes from 0 V to a Posi voltage or a Nega voltage (charging state) between the clear signal and the start pulse signal, i.e., during the refresh of the display unit, and the voltage is decreased to 0 V by light from the subpixels of the display unit which have shifted into the white display state after the start pulse signal. In the case where the subpixels of the display unit provide black display, the voltage does not decrease after the start pulse signal, and the Posi voltage or Nega voltage is maintained until the next clear signal is transmitted. The voltage values in FIG. 10 are examples and may be any voltage values.

The photoresistors and photodiodes may be any of those that decrease the voltage of the corresponding drain electrode in response to incidence of light. Examples of the photoresistors include photoresistors containing, for example, cadmium sulfide (CdS), amorphous silicon (a-Si), or low-temperature polycrystalline silicon (LTPS). Examples of the photodiodes include PN photodiodes, PIN photodiodes, and APD photodiodes.

The resistance of the photoresistors may be set to any value that allows switching of the light control unit states in response to incidence of light, and is preferably determined to meet the following conditions.

In a light control unit having a full HD resolution, the duration for which the voltage is substantially stable is represented by $5\times\tau$, where $\tau$ represents the RC time constant.

The RC time constant τ is represented by R×C, where R represents the resistance and C represents the liquid crystal capacitance. Supposing that the light control unit is driven at 60 Hz, the stability time (5τ) during black display needs to be equal to or longer than the duration of one period, 1/60s=16667 μs, because during black display, complete black display is required where no current leakage from the light control unit occurs. The RC time constant (5τ) during white display needs to be equal to or shorter than 16667 μs/1080=15 μs which corresponds to the ON duration per gate because during white display, current leakage from the light control unit is required to occur to accomplish the complete white display (transparent state) within a period shorter than the ON duration per gate. The resistance R satisfying the stability time (5τ) when the light control material is a liquid crystal having a liquid crystal capacitance C=300 fF is calculated to be about 11 GΩ or higher during black display and about 10 MΩ or lower during white display. Thus, preferably, the photoresistors have a resistance during white display of 1/1000 or less of the resistance during black display.

The material of the light control layer is preferably one that can make the light control unit to be in the transparent state during no voltage application and in the opaque state during voltage application. Examples of such a material include liquid crystal materials, electronic paper materials, and electrowetting materials. When the material of the light control layer is a liquid crystal material, the liquid crystal mode is not limited.

The dye can be any dye used for conventional guest host liquid crystals. Examples thereof include common dichroic dyes such as G-472.

The light control unit in Embodiment 3 includes a light blocking layer above the photoresistors or the photodiodes.

As shown in FIG. 9, the light blocking layer 234 in the light control unit 200 coincides with the light blocking layer in the display unit 100, and is formed also above the photoresistors 213 to prevent malfunction of the photoresistors 213 due to external light. Thus, apertures D of the subpixels of the light control unit 200 are smaller than apertures C of the subpixels of the display unit 100.

Layers constituting the light control unit other than the light control layer, the photoresistors, and the photodiodes can be ones similar to those used in a conventional normally white display element including a TFT substrate.

A specific example of the effect of using the display device of Embodiment 3 is described. A light control unit having the structure shown in FIGS. 5 to 7 was produced. The light control unit had a light (0.1 cd/$m^2$) transmittance during black display of the display unit of 6% and a light (200 cd/$m^2$) transmittance during white display of the display unit of 60%. This light control unit was disposed on a liquid crystal display having a CR of 2000. The resulting display device had a CR of 20000.

Embodiment 4

Figure 11:
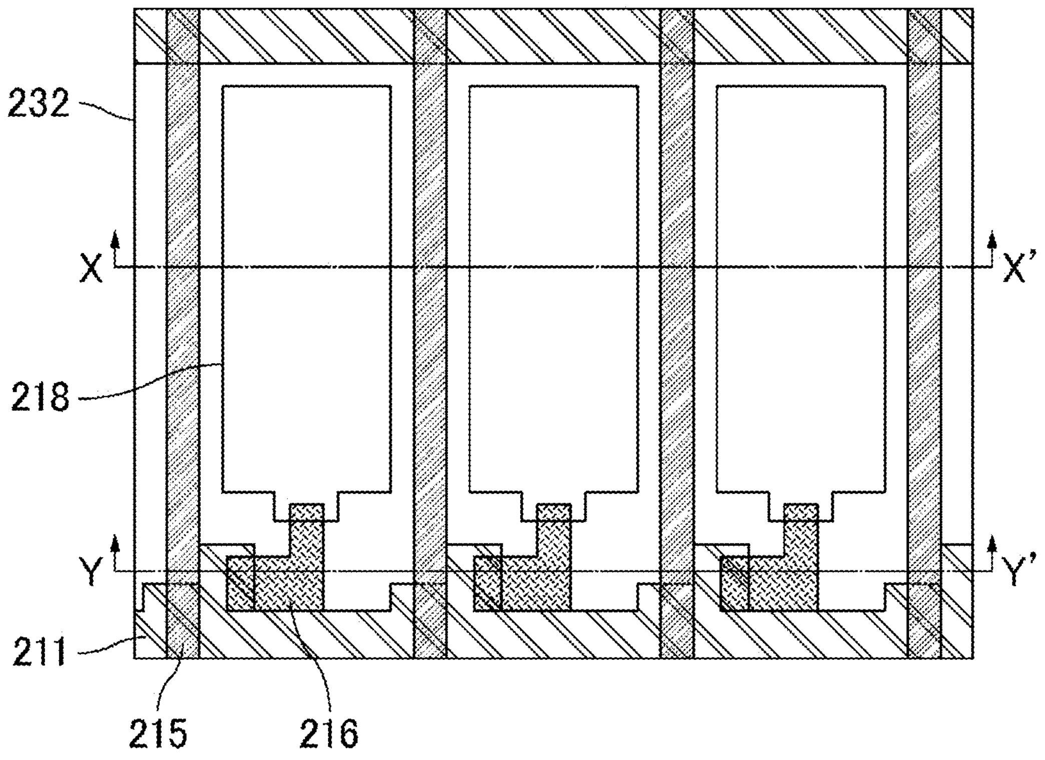
FIG. 11 is a top view of a light control unit in a display device of Embodiment 4.
Figure 12:
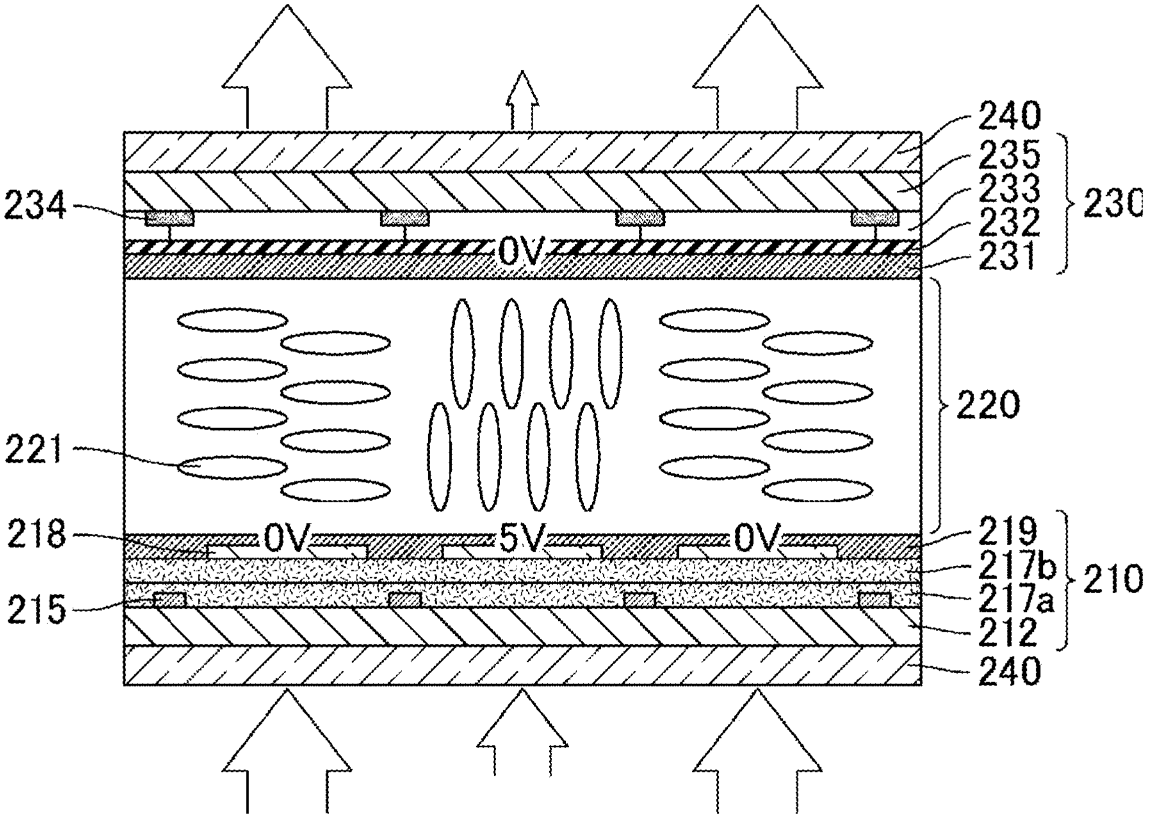
FIG. 12 is a cross-sectional view taken along the line X-X' in FIG. 11.
Figure 13:
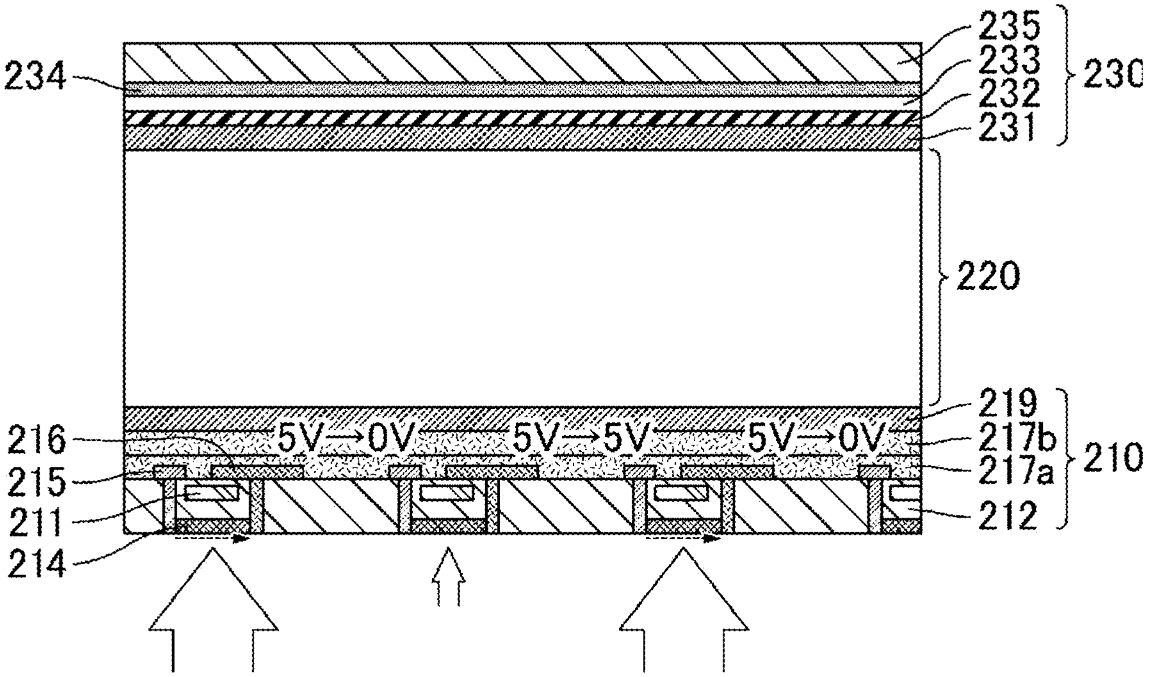
FIG. 13 is a cross-sectional view taken along the line Y-Y' in FIG. 11.

A display device of Embodiment 4 uses a normally white display element in which its light control unit includes a TFT substrate as in Embodiment 3, but differs from Embodiment 3 in that current and voltage leakage from the drain electrodes occurs in the semiconductor layer used in a conventional TFT display element. FIG. 11 is a top view of the light control unit in the display device of Embodiment 4. FIG. 12 is a cross-sectional view taken along the line X-X' in FIG. 11. FIG. 13 is a cross-sectional view taken along the line Y-Y' in FIG. 11.

As shown in FIGS. 11 to 13, the light control unit in the display device of Embodiment 4 has a structure including the TFT substrate 210, the counter substrate 230, the light control layer 220 disposed between these substrates, and polarizing plates 240 having polarization axes of 0° and 90° disposed respectively on the bottom face of the TFT substrate and on the top face of the counter substrate. The TFT substrate 210 includes a stack of the semiconductor layer 214, the gate electrodes 211, the gate insulating layer 212, the source electrodes 215, the drain electrodes 216, the first interlayer insulating layer 217*a*, the second interlayer insulating layer 217*b*, the pixel electrodes 218, and the alignment film 219. The counter substrate 230 includes, on the alignment film 231, a stack of the counter electrode 232, the overcoat layer 233, the light blocking layer 234, and the substrate 235. The light control layer 220 contains the liquid crystal material 221 horizontally aligned at an azimuthal angle of 45°. The polarizing plates 240 are disposed in crossed Nicols and such that the polarization axis of the light control layer matches the polarization axis of polarized light from the display unit. The semiconductor layer 214 connects a source electrode 215 and a corresponding drain electrode 216 and is disposed at positions where visible light from the display unit is incident. The light blocking layer 234 is disposed above the semiconductor layer 214. In addition, the alignment of the liquid crystal material 221 changes to make the light control unit in the transparent state during no voltage application and in the opaque state during voltage application. The basic state (state where only the light control unit is driven) is the opaque state where voltage is applied to all the subpixels.

In FIGS. 11 to 13, the light control layer is an electrically controlled birefringence (ECB) liquid crystal. Still, any material may be used as long as the light control layer is in the state (transparent state) where incident light is transmitted through the upper polarizing plate during no voltage application, and the light control layer is in the state (opaque state) where incident light is not transmitted through the upper polarizing plate during voltage application. Also, FIGS. 11 and 12 show that the voltage of the light control layer is 5 V in the opaque state and is 0 V in the transparent state. Still, the voltage is not limited to these values as long as the light control unit can switch between the transparent state and the opaque state. Furthermore, the semiconductor layer 214 is not limited to the top-gate structure as shown in FIG. 13 as long as being disposed such that light from the display unit is incident on the semiconductor layer.

As shown in FIGS. 11 to 13, when light from the display unit is incident on the semiconductor layer 214 in the subpixels (left and right subpixels) above the subpixels providing white display, the off resistance of the semiconductor layer 214 decreases to cause current leakage from the drain electrodes 216 to the source electrodes 215, thus decreasing the voltage of the drain electrodes 216. As a result, in the subpixels in which light has been incident on the semiconductor layer 214, voltage application to the light control layer 220 stops, so that the subpixels of the light control unit shift into the transparent state to transmit light from the subpixels of the display unit providing white display. The transparent state continues until light is no more applied to the semiconductor layer 214, i.e., until the subpixels of the display unit directly below the semiconductor layer 214 provide black display. Meanwhile, in a subpixel (central subpixel) above a subpixel providing black display, light incident on the semiconductor layer 214 is weak and does not change the off resistance of the semiconductor layer 214 to the degree that the current leaks, so that the state where voltage is applied, i.e., the opaque state of the light control unit, is maintained. This significantly reduces light leakage from the display unit to increase the contrast ratio. In the display device of Embodiment 4, the transparent state and the opaque state of the light control layer are switched by light from the display unit as in Embodiment 3, the contrast ratio can be increased by less complicated control than dual-cell display devices. In addition, the display device of Embodiment 4 has an advantageously simpler structure than that in Embodiment 3 since no photoresistor is used.

Figure 14:
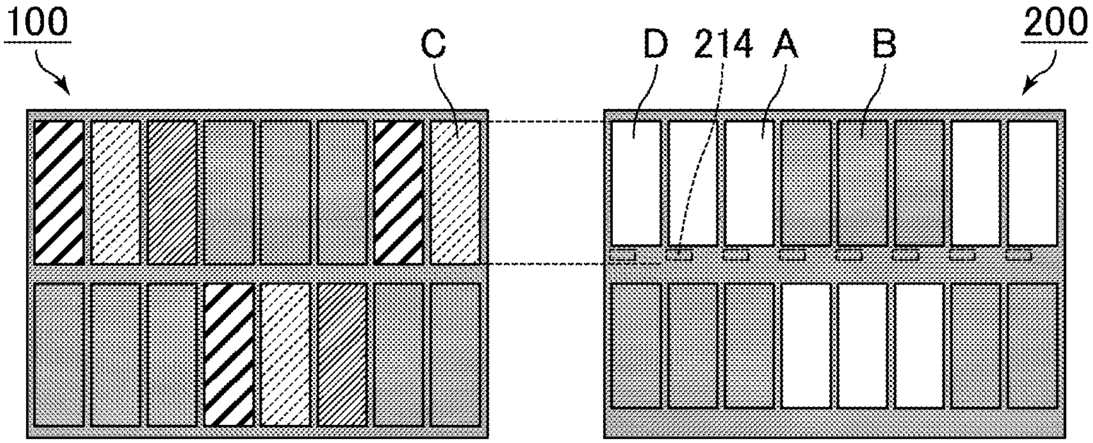
FIG. 14 includes schematic views showing an example of display on a display unit and an example of display on a light control unit in the display device of Embodiment 4.

FIG. 14 includes schematic views showing an example of display on the display unit and an example of display on the light control unit in the display device of Embodiment 4. In the display unit 100 in FIG. 14, subpixels filled with oblique lines provide white display, and subpixels filled with solid gray provide black display.

When the display unit 100 is in the display state shown on the left in FIG. 14, in the subpixels (e.g., subpixel A) of the light control unit 200 above the subpixels providing white display, light is incident on the semiconductor layer 214 to decrease the voltage of the drain electrode, so that the voltage application to the light control layer stops, which leads to the transparent state. Meanwhile, in the subpixels (e.g., subpixel B) of the light control unit 200 above the subpixels providing black display, the state where voltage is applied to the light control layer, i.e., the opaque state, is maintained because light as much as significantly decreasing the resistance of the semiconductor layer 214 does not reach the semiconductor layer 214. The light control unit thus significantly reduces light leakage in the subpixels providing black display in the display unit 100, thus increasing the contrast ratio of the display device.

Control of the light control unit in the display device of Embodiment 4 is similar to that in Embodiment 3. As described above, the voltage control as shown in the timing diagram in FIG. 10 enables the light control unit to switch into the basic state during the refresh of the display unit.

The material of the semiconductor layer may be any semiconductor that absorbs visible light and can define a TFT structure, such as amorphous silicon (a-Si) or low-temperature polycrystalline silicon (LTPS).

The resistance of the semiconductor layer is similar to that in Embodiment 3. For example, when the light control material is a liquid crystal having a liquid crystal capacitance of 300 fF and the light control unit is a full-HD one driven at 60 Hz, the transmittance values of the light control unit can be switched according to the display state of the display unit as long as the resistance during black display is 20 GΩ or higher and the resistance during white display is 10 MΩ or lower. The semiconductor layer preferably has a resistance during white display of 1/1000 or less of the resistance during black display.

The material of the light control layer may be any material that can make the light control unit in the transparent state during no voltage application and in the opaque state during voltage application. Examples of such a material include liquid crystal materials, electronic paper materials, and electrowetting materials. In the case where the material of the light control layer is a liquid crystal material, the liquid crystal mode is not limited. Examples of the liquid crystal mode other than the ECB mode include the twisted nematic (TN) mode, the vertical alignment (VA) mode, and the field fringe switching (FFS) mode.

The light control unit in Embodiment 4 includes the light blocking layer above the semiconductor layer.

As shown in FIG. 14, the light blocking layer 234 in the light control unit 200 coincides with the light blocking layer in the display unit 100, and is formed also above the semiconductor layer 214 to prevent malfunction of the semiconductor layer 214 due to external light. Thus, apertures D of the subpixels of the light control unit 200 are smaller than apertures C of the subpixels of the display unit 100.

Layers constituting the light control unit other than the light control layer can be ones similar to those used in a conventional normally white display element including a TFT substrate.

A specific example of the effect of using the display device of Embodiment 4 is described. A light control unit having the structure shown in FIGS. 11 to 13 was produced. The light control unit had a light (0.1 cd/m$^2$) transmittance during black display of the display unit of 0.08% and a light (200 cd/m$^2$) transmittance during white display of the display unit of 80%. This light control unit was disposed on a liquid crystal display having a CR of 2000. The resulting display device had a CR above 1000000.

REFERENCE SIGNS LIST

100: display unit
200: light control unit
210: TFT substrate
211: gate electrode
212: gate insulating layer
213: photoresistor or photodiode
214: semiconductor layer
215: source electrode
216: drain electrode
217*a*: first interlayer insulating layer
217*b*: second interlayer insulating layer
218: pixel electrode
219: alignment film
220: light control layer
221: liquid crystal material
222: dye
230: counter substrate
231: alignment film
232: counter electrode
233: overcoat layer
234: light blocking layer
235: substrate
A: light control unit part, photochromic material, or subpixel of light control unit above subpixel providing white display
B: light control unit part, photochromic material, or subpixel of light control unit above subpixel providing black display
C: aperture of subpixel of display unit
D: aperture of subpixel of light control unit

What is claimed is:

1. A display device comprising:
a display unit; and
a light control unit disposed adjacent to a light emitting surface side of the display unit,
the light control unit exhibiting a higher visible light transmittance as an intensity of visible light incident from the display unit increases.

2. The display device according to claim 1,
wherein the display unit is a liquid crystal display including a pair of polarizing plates and a liquid crystal layer sandwiched between the pair of polarizing plates.

3. The display device according to claim 1, wherein the display unit is a self-luminous type display.

4. The display device according to claim 1, wherein the light control unit includes a photochromic material layer containing a photochromic material and a UV front light disposed adjacent to the photochromic material layer, and the photochromic material shifts into a state that allows passage of visible light in response to incidence of visible light from the display unit and shifts into a state that blocks visible light in response to incidence of UV light from the UV front light.

5. The display device according to claim 4, wherein the photochromic material is aligned in a constant direction in the photochromic material layer, and the photochromic material layer has an absorption axis parallel to a polarization axis of emission light from the display unit.

6. The display device according to claim 1, wherein the light control unit is a normally white display element including a TFT substrate, the TFT substrate includes drain electrodes, source electrodes, and photoresistors or photodiodes disposed at positions where visible light from the display unit is incident, the photoresistors or the photodiodes each connect a corresponding drain electrode to one of the source electrodes adjacent to the drain electrode, and the light control unit includes a light blocking layer above the photoresistors or the photodiodes.

7. The display device according to claim 1, wherein the light control unit is a normally white display element including a TFT substrate, the TFT substrate includes a semiconductor layer at a position where visible light from the display unit is incident, and source electrodes and drain electrodes connected via the semiconductor layer, and the light control unit includes a light blocking layer above the semiconductor layer.

* * * * *